United States Patent
Honrao et al.

(10) Patent No.: US 12,446,172 B2
(45) Date of Patent: Oct. 14, 2025

(54) HOUSING ASSEMBLY HAVING BREAKAWAY LEG MEMBERS

(71) Applicant: ZF Friedrichshafen AG, Friedrichshafen (DE)

(72) Inventors: Tushar Honrao, Farmington Hills, MI (US); David Germany, Southfield, MI (US); Anjani Kumar, Northville, MI (US); Manojkumar Subhash Sonawane, Pune (IN)

(73) Assignee: ZF Friedrichshafen AG, Friedrichshafen (DE)

( * ) Notice: Subject to any disclaimer, the term of this patent is extended or adjusted under 35 U.S.C. 154(b) by 25 days.

(21) Appl. No.: 17/991,081

(22) Filed: Nov. 21, 2022

(65) Prior Publication Data

US 2024/0172379 A1    May 23, 2024

(51) Int. Cl.
H05K 5/02    (2006.01)
H05K 5/00    (2025.01)
H05K 5/04    (2006.01)

(52) U.S. Cl.
CPC ......... *H05K 5/0234* (2013.01); *H05K 5/0026* (2013.01); *H05K 5/04* (2013.01)

(58) Field of Classification Search
None
See application file for complete search history.

(56) References Cited

U.S. PATENT DOCUMENTS

| 11,026,340 B2 * | 6/2021 | Bessho | B60R 16/0239 |
| 2015/0282362 A1 * | 10/2015 | Nuriya | H05K 5/0056 361/728 |
| 2022/0295656 A1 * | 9/2022 | Uchida | H05K 5/0221 |

\* cited by examiner

*Primary Examiner* — James Wu
*Assistant Examiner* — Christopher L Augustin
(74) *Attorney, Agent, or Firm* — Kristin L. Murphy

(57) ABSTRACT

A housing assembly can include a housing structure and a plurality of leg members. At least one leg member of the plurality of leg members comprises a foot portion and at least one connecting portion. The at least one leg member can define a first concave portion disposed between the foot portion and a first convex portion, and the first convex portion is disposed between the first concave portion and a second concave portion. A radius of the first concave portion can be equal to a radius of the first convex portion.

20 Claims, 3 Drawing Sheets

HOUSING ASSEMBLY HAVING BREAKAWAY LEG MEMBERS

TECHNICAL FIELD

The present disclosure relates to a housing assembly having leg members for protecting an electronic control unit (ECU).

BACKGROUND

ECUs are control units that can be installed behind the dashboard or in between driver and passenger seats of a vehicle. One type of ECU controls the function of the vehicle such as airbags, for example, by controlling a series of actuators based on input from crash sensors that are onboard of the vehicle.

However, crash events, the house assembly may be subject to damage, adversely interfering with operation of the ECU, which may lead to a malfunction of the ECU. Accordingly, what is needed is an arrangement to protect the ECU in an event of a crash event.

SUMMARY

A housing assembly can include a housing structure and a plurality of leg members. At least one leg member of the plurality of leg members comprises a foot portion and at least one connecting portion. The at least one leg member can define a first concave portion disposed between the foot portion and a first convex portion, and the first convex portion is disposed between the first concave portion and a second concave portion. A radius of the first concave portion can be equal to a radius of the first convex portion.

In another exemplary arrangement the housing assembly may include having the second concave portion proximal to an interface of the at least one connecting portion and a side surface of the housing structure and a third concave portion that is disposed opposite of the first concave portion, where a radius ratio corresponding to radii of the first concave portion, the first convex portion, the second concave portion, and the third concave portion comprises 1:1:1:1.

In another exemplary arrangement, the radius of the first convex portion comprises about one millimeter.

In another exemplary arrangement, at least one leg member is configured to separate from the housing structure when a predetermined static load force is exerted on the housing assembly.

In another exemplary arrangement, the housing assembly may include an electronic control unit, wherein the housing structure is configured to retain the electronic control unit.

In another exemplary arrangement, the housing assembly includes an electrical connector that is configured to provide an electrical connection to the electronic control unit.

In another exemplary arrangement, the housing assembly includes an overhang that extends outwardly from an upper surface of the housing structure.

In another exemplary arrangement, the overhang is integral with the housing structure.

In another exemplary arrangement, the housing structure comprises die cast metal.

In another exemplary arrangement, the die cast metal comprises aluminum.

A housing assembly may include a housing structure and an electronic control unit disposed within the housing structure. The housing assembly also includes a plurality of leg members. Each leg member can define a first concave portion disposed between the foot portion and a first convex portion, and the first convex portion is disposed between the first concave portion and a second concave portion. A radius of the first concave portion can be equal to a radius of the first convex portion.

In another exemplary arrangement, the housing assembly includes the second concave portion proximal to an interface of the connecting portion and a side surface of the housing structure and a third concave portion that is disposed opposite of the first concave portion, where a radius ratio corresponding to radii of the first concave portion, the first convex portion, the second concave portion, and the third concave portion comprises 1:1:1:1.

In another exemplary arrangement, the radius of the first convex portion comprises about one millimeter.

In another exemplary arrangement, at least one leg member is configured to separate from the housing structure when a predetermined static load force is exerted on the housing assembly.

In another exemplary arrangement, the housing assembly includes an electrical connector that is configured to provide an electrical connection to the electronic control unit.

In another exemplary arrangement, the housing assembly includes an overhang that extends outwardly from an upper surface of the housing structure.

In another exemplary arrangement, the overhang is integral with the housing structure.

In another exemplary arrangement, the housing structure comprises die cast metal.

In another exemplary arrangement, the stamped metal comprises of die cast aluminum.

A housing assembly may include a diecast housing structure and an electronic control unit disposed within the diecast housing structure. The housing assembly also includes a plurality of leg members. Each leg member can define a first concave portion disposed between the foot portion and a first convex portion, and the first convex portion is disposed between the first concave portion and a second concave portion. A radius of the first concave portion can be equal to a radius of the first convex portion.

Further areas of applicability will become apparent from the description provided herein. It should be understood that the description and specific examples are intended for purposes of illustration only and are not intended to limit the scope of the present disclosure.

BRIEF DESCRIPTION OF THE DRAWINGS

The drawings described herein are for illustration purposes only and are not intended to limit the scope of the present disclosure in any way.

DETAILED DESCRIPTION

Figure 1:
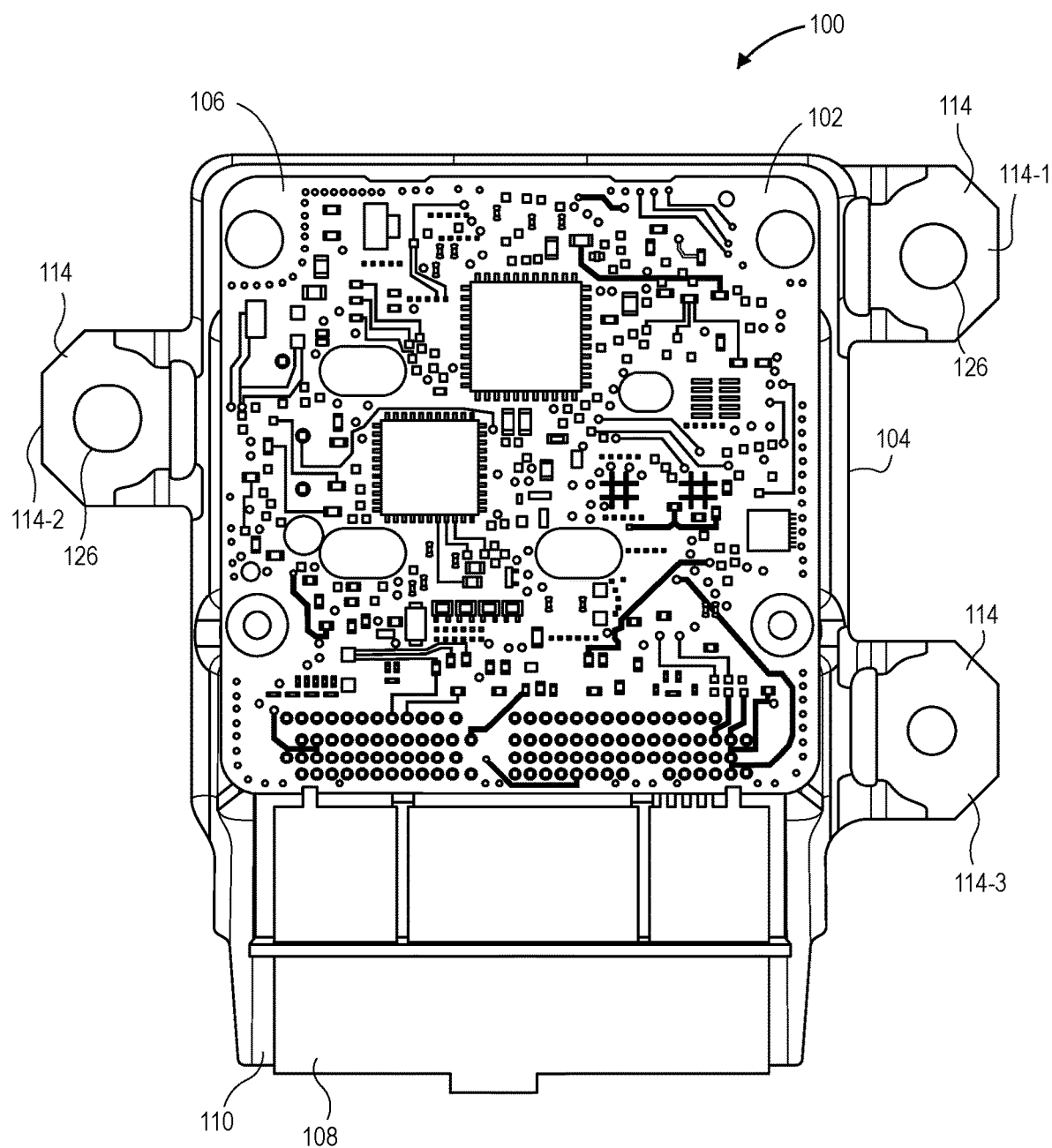
FIG. 1 is a bottom view of a housing assembly that includes a housing structure retaining an electronic control unit.
Figure 2:
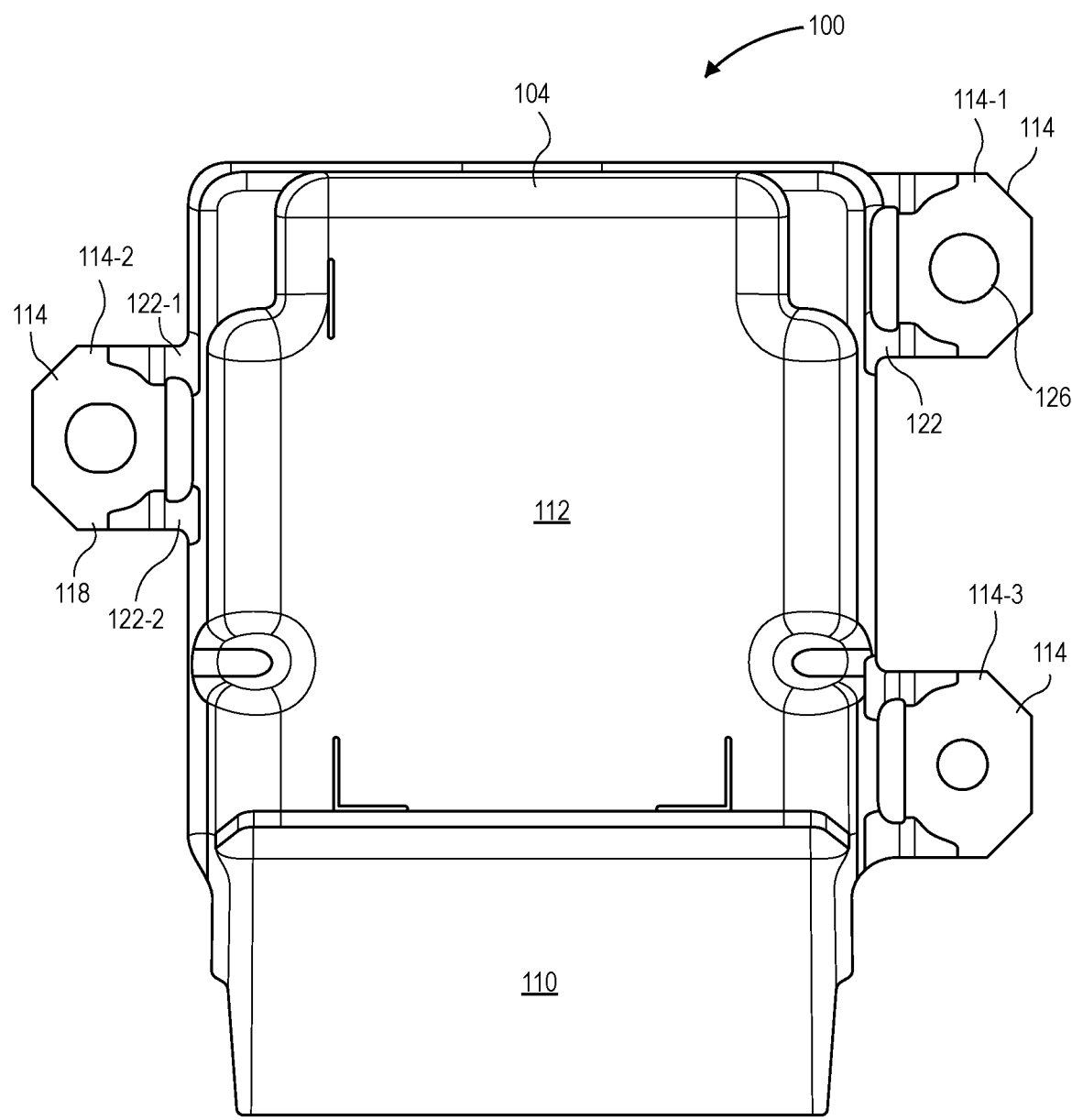
FIG. 2 is a plan view of the housing assembly.

The following description is merely exemplary in nature and is not intended to limit the present disclosure, application, or uses.

FIGS. 1 through 4 illustrate an exemplary housing assembly 100 that protects an electronic control unit (ECU) 102 via a housing structure 104. For example, in one exemplary arrangement, the ECU 102 may comprise an airbag ECU. The ECU 102 can include a circuit board 106 that is retained within the housing structure 104 of the housing assembly 100. For example, in one exemplary arrangement the circuit board 106 can be mounted to the housing structure 104 with one or more fasteners.

The housing assembly 100 can also include an electrical connector 108 and an overhang 110. The electrical connector 108 can receive electrical interfaces and provide an electrical connection between various vehicle components and the ECU 102. The overhang 110 can comprise metal, such as aluminum. In one exemplary arrangement, the overhang 110 extends outwardly from an upper surface 112 of the housing structure 104. The overhang 110 can mitigate exposure of the electrical connector 108 to moisture and/or other foreign particles. In some exemplary implementations, the overhang 110 can be integral with the housing structure 104.

The housing structure 104 serves to mitigate intrusion of moisture and/or foreign particles into the housing assembly 100, and/or serve to protect the contents of the housing structure 104, generally. The housing structure 104 can comprise diecast metal, such as aluminum, and serves to encapsulate the ECU 102 when positioned within the vehicle.

As shown, the housing structure 104 includes one or more leg members 114. In an example implementation, the housing structure 104 includes leg members 114-1, 114-2, 114-3. As discussed herein, the leg members 114 comprise a geometric configuration that allows the leg members 114 to separate from the housing structure 104 when subjected to a predetermined static load force. The separation of the leg members 114-1, 114-2, 114-3 from the mitigates damage to the housing structure 104 and/or ECU 102 that may result from the static load force. The predetermined static force can be determined via empirical analysis to determine a static force threshold that may cause damage to the housing structure 104 and/or ECU 102 in an event the leg members 114-1, 114-2, 114-3 do not break.

As shown in FIGS. 1 through 4, the leg members 114 can each comprise a foot portion 118 and connecting portions 122-1, 122-2. Each foot portion 118 may define a bore 126 that can receive a fastener for attaching the housing structure 104 within the vehicle. In some implementations, the foot portion 118 may define a fastener or other structure that engages with a corresponding structure. The foot portion 118 can interface with a surface of the vehicle and the connecting portions 122-1, 122-2 can interface with a side surface 128 of the housing structure 104. In an exemplary implementation, the leg members 114 are integral with the housing structure 104. For example, the housing structure 104 and the leg members 114 can be constructed through suitable metal casting and/or stamping processes.

Figure 3:
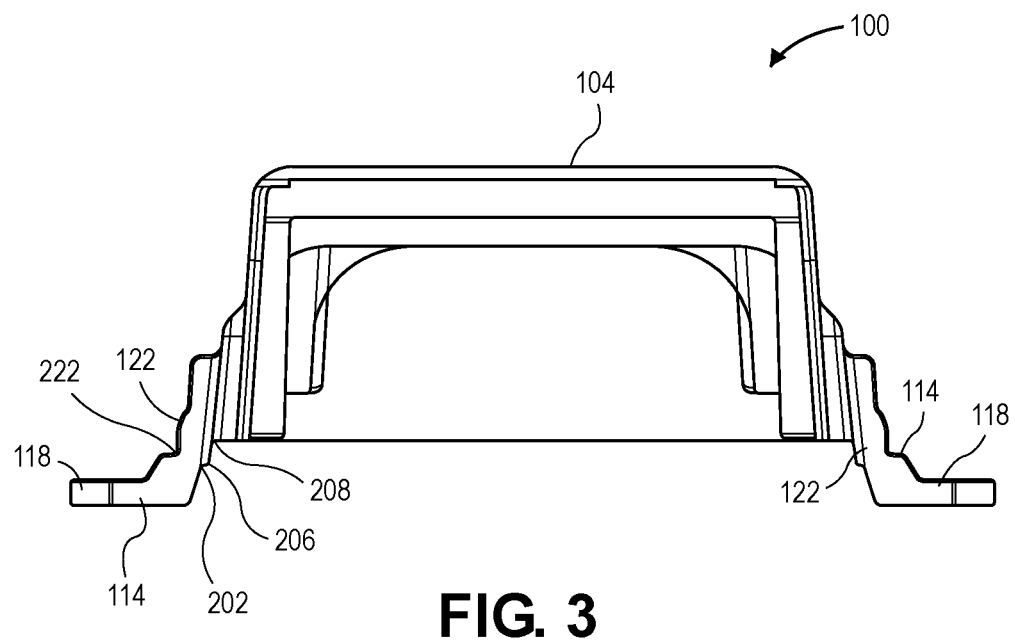
FIG. 3 is a side elevation view of the housing assembly.
Figure 4:
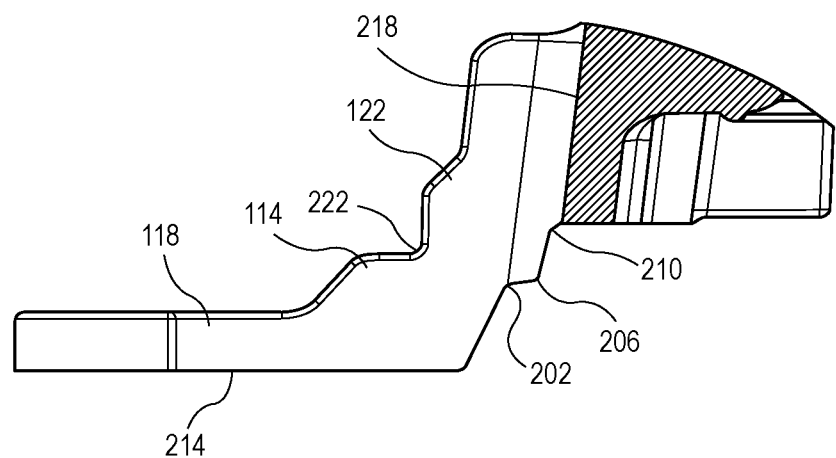
FIG. 4 is a cross-sectional view of a leg member of the housing assembly.

With reference to FIGS. 3 and 4, each leg member 114 can define a first concave portion 202, a first convex portion 206, and a second concave portion 210. As shown, the first concave portion 202 is positioned between a bottom surface 214 of the foot portion 218 and the first convex portion 206. The first convex portion 206 is positioned between the first concave portion 202 and a second concave portion 210. The second concave portion 210 is positioned between the first convex portion 206 and an interface 218 of the housing structure 104 and the connecting portions 122-1, 122-2. The leg member 114 can also define a third concave portion 222. As shown, the third convex portion 222 is position generally opposite of the first concave portion 202.

The concave portions 202, 210, 222 and the convex portion 206 can allow the leg member 114 to separate, or break away, from the housing structure 104 when a predetermined static load force is exerted. It is understood that a portion of the leg member 114 may be retained by the housing structure 104 in some instances.

In an exemplary implementation, a radius of the first concave portion 202, a radius of the second concave portion 210, and a radius of the third concave portion 222 are equal. In this implementation, a radius of the convex portion 206 is equal to the radii of the concave portions 202, 210, 222.

The geometric parameters of the leg member 114 can comprise a ratio of about 1:1:1:1, i.e., a radius ratio, which represents the ratio of the radius of the concave portion 202 to the radius of the convex portion 206 to the radius of the concave portion 210 to the radius of the concave portion 222.

In an exemplary implementation, the radii of the concave portions 202, 210, 222 and the radius of the convex portion 206 comprises about one millimeter (1 mm).

Throughout the present disclosure, the numerical values represent approximate measures or limits to ranges to encompass minor deviations from the given values and embodiments having about the value mentioned as well as those having exactly the value mentioned. The numerical values of parameters in this specification, including the appended claims, are to be understood as being modified in all instances by the term "about" whether or not "about" actually appears before the numerical value. "About" indicates that the stated numerical value allows some slight imprecision (with some approach to exactness in the value; approximately or reasonably close to the value; nearly). If the imprecision provided by "about" is not otherwise understood in the art with this ordinary meaning, then "about" as used herein indicates at least variations that may arise from ordinary methods of measuring and using such parameters. For example, "about" may comprise a variation of less than or equal to 5%, optionally less than or equal to 4%, optionally less than or equal to 3%, optionally less than or equal to 2%, optionally less than or equal to 1%, optionally less than or equal to 0.5%, and in certain aspects, optionally less than or equal to 0.1%.

It is to be understood that the above description is intended to be illustrative and not restrictive. Many implementations and applications other than the examples provided would be apparent to those of skill in the art upon reading the above description. The scope of the invention should be determined, not with reference to the above description, but should instead be determined with reference to the appended claims, along with the full scope of equivalents to which such claims are entitled. It is anticipated and intended that future developments may occur in the arts discussed herein, and that the disclosed systems and methods will be incorporated into such future implementations. In sum, it should be understood that the invention is capable of modification and variation and is limited only by the following claims.

All terms used in the claims are intended to be given their plain and ordinary meanings as understood by those skilled in the art unless an explicit indication to the contrary in made herein. In particular, use of the singular articles such as "a," "the," "said," etc. should be read to recite one or more of the indicated elements unless a claim recites an explicit limitation to the contrary.

What is claimed is:

1. A housing assembly comprising:
  a housing structure; and a plurality of leg members, wherein each leg member of the plurality of leg members comprises a foot portion and a plurality of connecting portions that interface with a side surface of the housing structure, wherein each leg member defines, extending from a bottom surface thereof, a first concave portion disposed between the foot portion and a first convex portion also on the bottom surface, wherein the first convex portion is disposed between the first concave portion and a second concave portion, wherein a radius of the first concave portion is equal to a radius of the first convex portion.

2. The housing assembly as recited in claim 1, further comprising:

the second concave portion being proximal to an interface of the connecting portion and a side surface of the housing structure; and a third concave portion that is disposed opposite of the first concave portion, wherein a radius ratio corresponding to radii of the first concave portion, the first convex portion, the second concave portion, and the third concave portion comprises 1:1:1:1.

3. The housing assembly as recited in claim 1, wherein the radius of the first convex portion comprises about one millimeter.

4. The housing assembly as recited in claim 1, wherein at least one leg member is configured to separate from the housing structure when a sufficient static load force is exerted on the housing assembly.

5. The housing assembly as recited in claim 1, further comprising an electronic control unit, wherein the housing structure is configured to retain the electronic control unit.

6. The housing assembly as recited in claim 5, further comprising an electrical connector that is configured to provide an electrical connection to the electronic control unit.

7. The housing assembly as recited in claim 6, further comprising an overhang that extends outwardly from an upper surface of the housing structure.

8. The housing assembly as recited in claim 7, wherein the overhang is integral with the housing structure.

9. The housing assembly as recited in claim 1, wherein the housing structure comprises die cast metal.

10. The housing assembly as recited in claim 9, wherein the die cast metal comprises aluminum.

11. A housing assembly comprising:
a housing structure; and
an electronic control unit disposed within the housing structure;
a plurality of leg members, wherein each leg member of the plurality of leg members comprises a foot portion and a plurality of connecting portions that interface with a side surface of the housing structure, wherein the connection portions are separated from one another to define a gap therebetween, wherein each leg member defines a first concave portion disposed between the foot portion and a first convex portion, wherein the first convex portion is disposed between the first concave portion and a second concave portion, wherein a radius of the first concave portion is equal to a radius of the first convex portion.

12. The housing assembly as recited in claim 11, further comprising:

a second concave portion proximal to an interface of the connecting portion and a side surface of the housing structure; and a third concave portion that is disposed opposite of the first concave portion, wherein a radius ratio corresponding to radii of the first concave portion, the first convex portion, the second concave portion, and the third concave portion comprises 1:1:1:1.

13. The housing assembly as recited in claim 11, wherein the radius of the first convex portion comprises about one millimeter.

14. The housing assembly as recited in claim 11, wherein at least one leg member is configured to separate from the housing structure when a sufficient static load force is exerted on the housing assembly.

15. The housing assembly as recited in claim 11, further comprising an electrical connector that is configured to provide an electrical connection to the electronic control unit.

16. The housing assembly as recited in claim 15, further comprising an overhang that extends outwardly from an upper surface of the housing structure.

17. The housing assembly as recited in claim 16, wherein the overhang is integral with the housing structure.

18. The housing assembly as recited in claim 11, wherein the housing structure comprises diecast metal.

19. The housing assembly as recited in claim 18, the die cast metal comprises aluminum.

20. A housing assembly comprising:
a diecast housing structure; and
an electronic control unit disposed within the diecast housing structure;
a plurality of leg members, wherein each leg member of the plurality of leg members comprises a foot portion and a plurality of connecting portions,
wherein each leg member defines a first concave portion disposed between the foot portion and a first convex portion disposed on a bottom surface of the leg member, wherein the first convex portion is disposed between the first concave portion and a second concave portion, wherein a radius of the first concave portion is equal to a radius of the first convex portion.

* * * * *